(12) United States Patent
Chia et al.

(10) Patent No.: US 11,586,259 B2
(45) Date of Patent: Feb. 21, 2023

(54) INCORPORATING HEAT SPREADER TO ELECTRONICS ENCLOSURE FOR ENHANCED COOLING

(71) Applicant: Cisco Technology, Inc., San Jose, CA (US)

(72) Inventors: Vic Hong Chia, Sunnyvale, CA (US); Joseph Francis Jacques, Austin, TX (US); John Scott Scheeler, Pleasanton, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/235,040

(22) Filed: Apr. 20, 2021

(65) Prior Publication Data

US 2022/0334624 A1    Oct. 20, 2022

(51) Int. Cl.
*G06F 1/20* (2006.01)
*H05K 7/20* (2006.01)

(52) U.S. Cl.
CPC ........... *G06F 1/20* (2013.01); *H05K 7/20154* (2013.01); *H05K 7/20336* (2013.01)

(58) Field of Classification Search
CPC ... H05K 7/20154; H05K 7/20336; G06F 1/20
See application file for complete search history.

(56) References Cited

U.S. PATENT DOCUMENTS

| | | | |
|---|---|---|---|
| 7,764,504 B2 | 7/2010 | Phillips et al. | |
| 8,879,262 B2 * | 11/2014 | Shi | G02B 6/4246 165/185 |
| 9,547,344 B2 | 1/2017 | Han | |
| 11,271,348 B1 * | 3/2022 | Chen | H05K 7/20418 |
| 2012/0268890 A1 * | 10/2012 | Stock | G06F 1/20 361/679.53 |
| 2015/0268704 A1 * | 9/2015 | Chiriac | F28F 21/00 165/185 |
| 2016/0088775 A1 * | 3/2016 | Bailey | H05K 7/20727 165/185 |
| 2017/0064868 A1 | 3/2017 | Rush et al. | |
| 2018/0239404 A1 * | 8/2018 | Siddiqui | G06F 1/206 |
| 2019/0051580 A1 * | 2/2019 | Liu | H01L 23/4093 |
| 2019/0230817 A1 * | 7/2019 | Han | F28F 3/06 |
| 2020/0042053 A1 * | 2/2020 | Cheng | H05K 7/20336 |
| 2020/0100386 A1 | 3/2020 | Saturley et al. | |
| 2020/0132392 A1 | 4/2020 | Joshi | |
| 2020/0257067 A1 * | 8/2020 | Meunier | G02B 6/4284 |

FOREIGN PATENT DOCUMENTS

EP    2938173 A1    10/2015
WO    2021010874 A1    1/2021

* cited by examiner

*Primary Examiner* — Stephen S Sul
(74) *Attorney, Agent, or Firm* — Edell, Shapiro & Finnan, LLC

(57) ABSTRACT

A cooling system for a computing device includes an outer chassis of the computing device, a heat spreader, a heat bridge, and a heat dissipating structure. The outer chassis of the computing device is configured to support heat generating modules. The heat spreader is integrated into the outer chassis. The heat bridge couples the heat spreader to a corresponding heat generating module at a first location in the computing device. The heat dissipating structure is coupled to the heat spreader at a second location in the computing device. The second location is positioned in the computing device to experience higher airflow than the first location.

20 Claims, 7 Drawing Sheets

INCORPORATING HEAT SPREADER TO ELECTRONICS ENCLOSURE FOR ENHANCED COOLING

TECHNICAL FIELD

The present disclosure relates to thermal management of electronic devices, especially rack mounted computing devices.

BACKGROUND

Computing devices include multiple electronic modules that generate heat within the computing device, which must be cooled to maintain the performance of the electronic modules. Typically, fans force airflow through the computing device to cool the heat generating modules. However, the airflow may not be uniform throughout the computing device, leading to areas of higher and lower airflow. Electronic modules that are positioned in an area of low airflow, or no airflow, may be limited in the amount of heat they can effectively dissipate, which places a limit on the power of these electronic modules. Some solutions for transferring heat from low airflow areas may include liquid cooling or thermoelectric coolers, but these solutions may require additional expenses to adopt the infrastructure investment, such as closed loop cooling distribution units for entire racks of computing devices.

DESCRIPTION OF EXAMPLE EMBODIMENTS

Overview

Figure 1A:
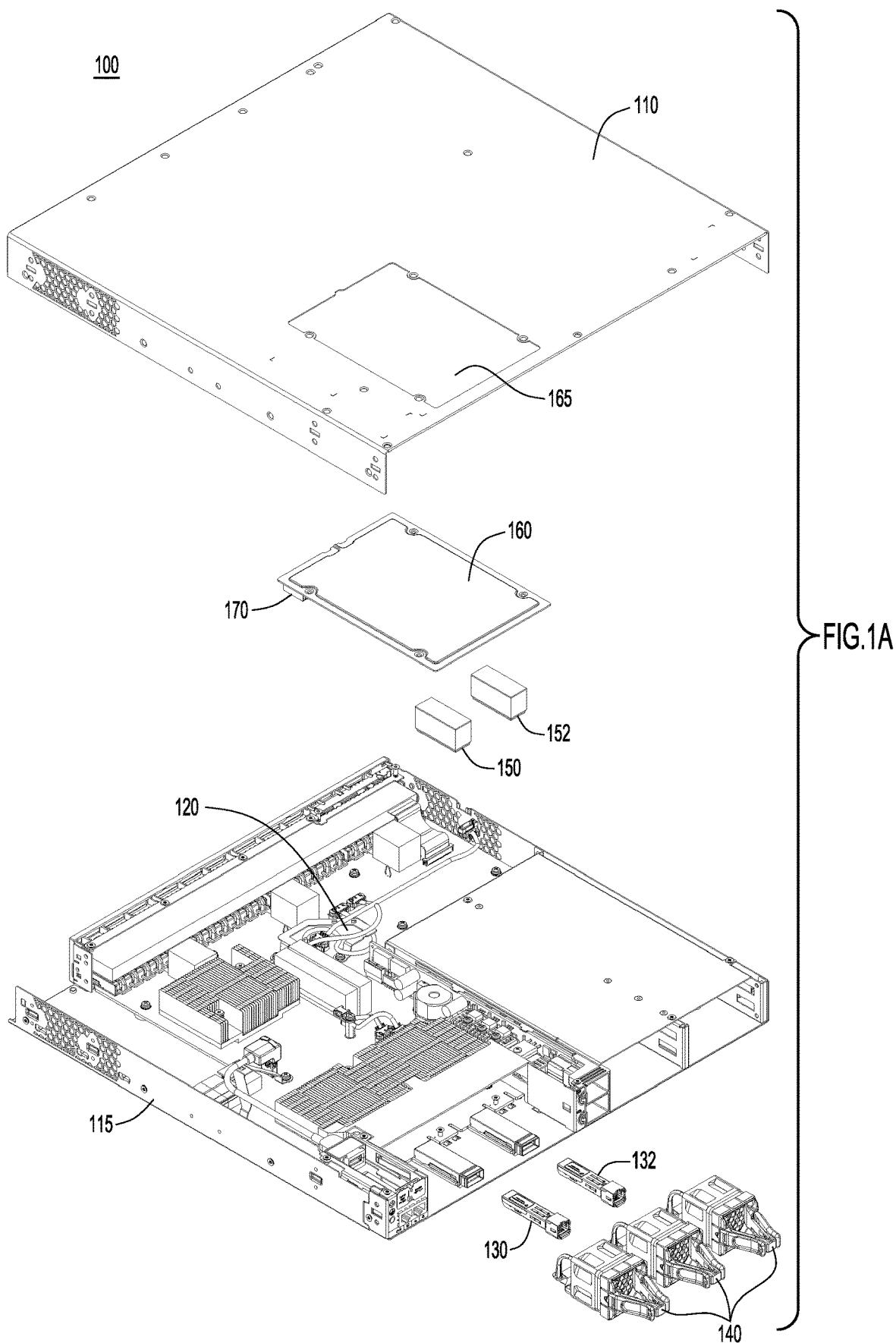
FIG. 1A is an exploded diagram of a computing device with an integrated heat spreader, according to an example embodiment.

An apparatus comprising an outer chassis of a computing device, a heat spreader, at least one heat bridge, and a heat dissipating structure is provided. The outer chassis of the computing device is configured to support a plurality of heat generating modules. The heat spreader is integrated into the outer chassis. The at least one heat bridge couples the heat spreader to at least one corresponding heat generating module at a first location in the computing device. The first heat dissipating structure is coupled to the heat spreader at a second location in the computing device. The second location is positioned in the computing device to experience higher airflow than the first location.

Example Embodiments

One of the value propositions for next generation network switches is to leverage the flexibility of next generation Application Specific Integrated Circuits (ASICs) to provide end user options to choose between a proprietary stacking mode or a standard Ethernet mode, rather than having dedicated stack ports. To maximize port counts, network switches may have limited space on the front panel for stacking without sacrificing downlink/uplink port density. Flexible stacking at on the rear face of the network switch provides one option to maximize port counts. In order to maintain 50 G×8 lanes for the stacking mode, Quad Small Form-Factor Pluggable-Double Density (QFSP-DD) modules may be used to enable Ethernet mode. However, QFSP-DD modules generate significant heat and the location at the rear of the network switch typically encounters minimal airflow in a front-to-back airflow system.

The techniques presented herein incorporate a heat spreader (e.g., a vapor chamber) into the top of the outer chassis of a computing device (e.g., a network switch) to avoid using space on a Printed Circuit Board (PCB) holding the electronic modules of the computing device. Heat generating modules contact a heat bridge to the heat spreader in the outer chassis. The heat spreader conducts heat to heat dissipation structure(s) (e.g., heat sinks with fins to transfer heat to the airflow that is forced through the computing device. The heat spreader enables the heat dissipating structure(s) to be placed in locations of the computing device that experience a higher volume of airflow than where the heat generating modules are placed.

Hereinafter, a heat transfer system describes moving heat from heat generating modules at the rear of a computing device to a heat dissipating structure in the middle of the computing device. However, the heat transfer system may also be applied to any number of heat generating modules and/or heat dissipating structures. Additionally, the heat generating modules are not limited to placement at the rear of the computing device, and the heat transfer system described herein may be used to transfer heat from multiple locations to one or more heat dissipating structures. Further, more than one heat spreader may be integrated into the outer chassis of the computing device to transfer heat from locations of relatively low airflow to locations of relatively high airflow.

Referring now to FIG. 1A, an exploded view of a computing device 100 is shown. The computing device 100 includes an outer chassis 110, which may be separated into two or more elements, such as the upper chassis 110 and the lower chassis 115. For simplicity, the outer chassis 110 as described herein may refer to any portion of the mechanical support structure surrounding the computing device 100. The outer chassis 110 may be constructed from a rigid material (e.g., steel or aluminum alloys) that is not thermally insulating, but may not be optimized for thermal conductivity.

The outer chassis 110 supports one or more heat generating modules 120 in the interior of the computing device 100. Heat generating modules 130 and 132 are disposed at the rear of the computing device 100 between fans 140. The fans 140 draw airflow from the front of the computing device 100 to cool the heat generating modules 120, 130, and 132. Heat bridges 150 and 152 conduct heat from the heat generating modules 130 and 132, respectively, to a heat spreader 160, such as a vapor chamber. The heat spreader 160 is integrated into an opening 165 in the top of the outer chassis 110. The heat spreader 160 conducts heat to a heat dissipating structure 170. The heat dissipating structure 170 is placed within the computing device such that the fans 140 draw a higher volume of airflow over the heat dissipating structure 170 than over the heat generating modules 130 and 132.

In one example, the computing device 100 may be a rack-mountable device, such as a network switch or router. The heat generating modules 120 may be the electronic modules that perform operations at the computing device 100, such as switching network traffic. The heat generating modules 130 and 132 may be optical networking modules (e.g., Quad Small Form-Factor Pluggable-Double Density (QFSP-DD) modules) that may generate significantly more heat than previous networking modules.

In another example, the heat bridges 150 and 152 may be blocks of thermally conductive material (e.g., metal). Alternatively, the heat bridges 150 and 152 may be finned heat dissipating structures that both conduct heat to the heat spreader 160 and dissipate heat through any airflow around the heat generating modules 130 and 132. Rear vents may be included in the outer chassis 110 near the heat bridges 150 and 152 to provide additional airflow.

The heat bridges 150 and 152 may be fastened (e.g., brazed or welded) to the heat generating modules 130 and 132, respectively, and/or to the heat spreader 160. A thermal interface material may be used to ensure solid thermal contact between the heat bridges 150 and 152, the heat generating modules 130 and 132, and the heat spreader 160. In a further example, a reinforced fiberglass with aluminum foil on the thermal interface material enables the heat generating modules 130 and 132 to be inserted/extracted from the computing device 100 while maintaining good thermal contact with the heat bridges 150 and 152, respectively.

In a further example, the heat spreader 160 may be a vapor chamber that efficiently conducts thermal energy throughout the heat spreader 160. The outer chassis 110 may be a steel or aluminum alloy cover that is slotted out to for the opening 165. A flange around the chassis opening 165 allows for more effective thermal contact between the vapor chamber and the chassis 110, which may further dissipate additional heat.

In yet another example, the heat dissipating structure 170 may comprise a plurality of heat sink fins. The heat sink fins of the heat dissipating structure 170 may be positioned in the airflow from the fans 140, and may be strategically positioned to accommodate the height of the heat generating modules 120 (e.g., ASICs or other electronic modules).

Figure 1B:
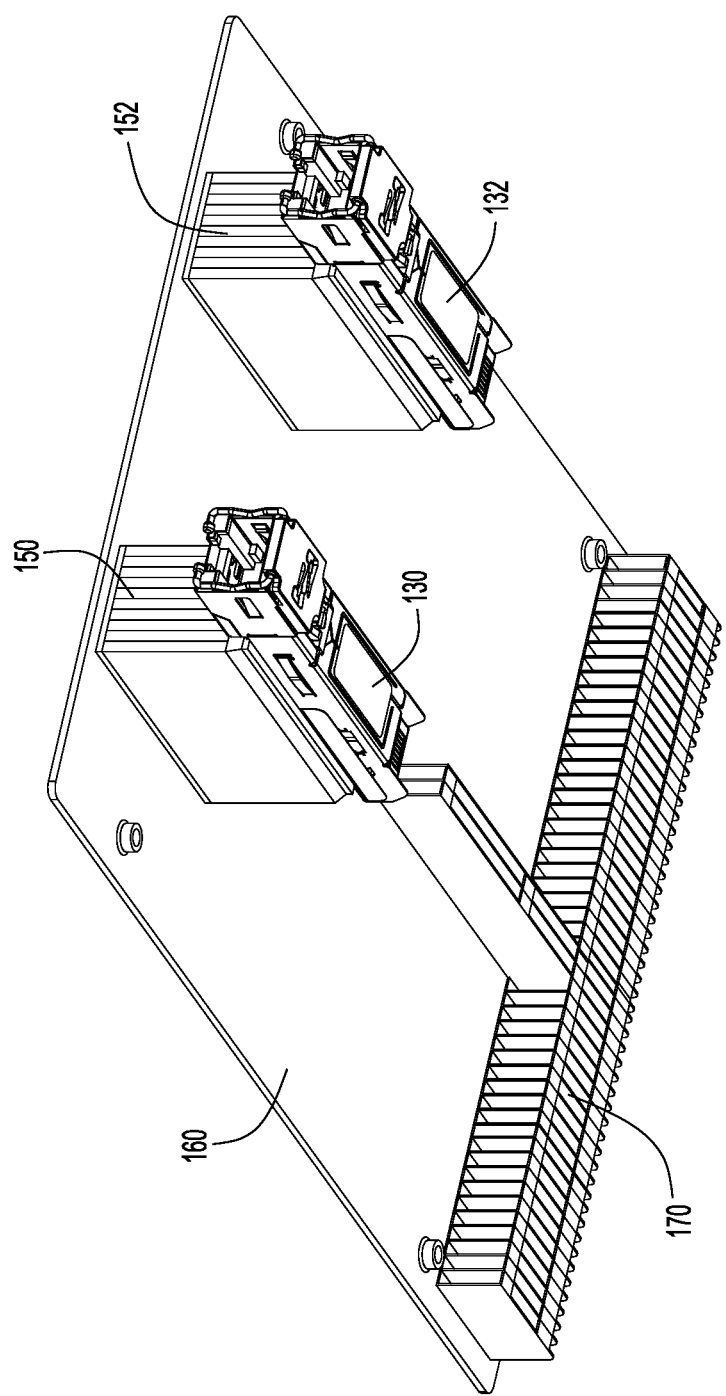
FIG. 1B is a perspective view of two heat generating modules connected to the heat spreader and a displaced heat dissipating structure, according to an example embodiment.

Referring now to FIG. 1B, a perspective drawing of an example of the cooling system to manage the thermal energy from the heat generating modules 130 and 132. The heat bridges 150 and 152 conduct heat from the heat generating modules 130 and 132, respectively, and transfer the heat to the heat spreader 160. The heat spreader 160 transfers the heat forward to the heat dissipating structure 170, where the airflow through the computing device 100 can remove the heat. In one example, the heat bridges 150 and 152 are also heat dissipating structures (e.g., finned heat sinks) that can transfer some thermal energy to any airflow that passes through the location of the heat generating modules 130 and 132. However, the airflow that passes through the heat dissipating structure 170 is higher than the airflow that passes through the heat bridges 150 and 152, as will be described hereinafter with respect to FIGS. 2-5.

Figure 2:
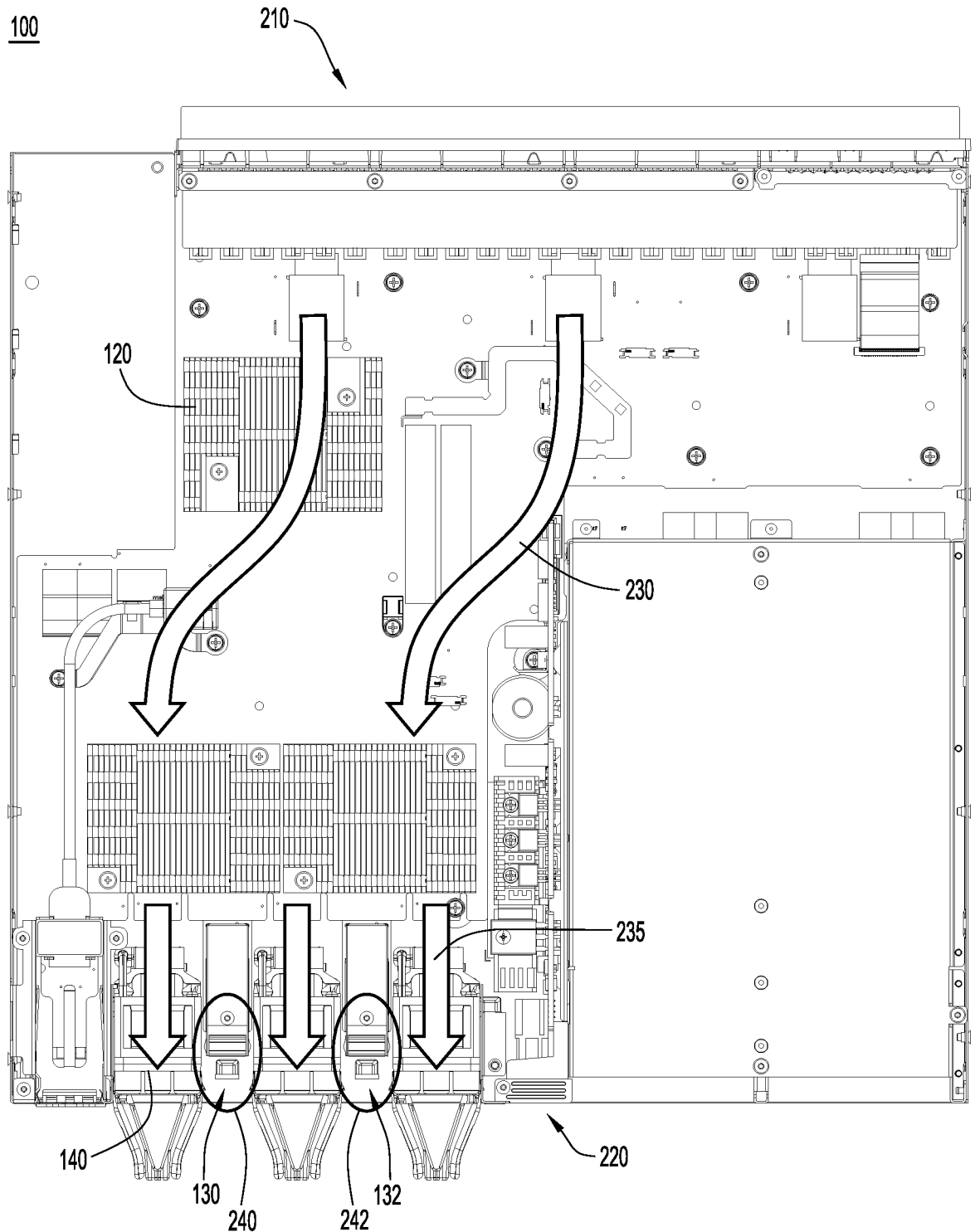
FIG. 2 is a top view of the computing device that shows the airflow through the computing device, according to an example embodiment.

Referring now to FIG. 2, a top view of the computing device 100 shows the airflow pulled through the computing device 100 by the fans 140. The fans 140 pull air from the front side 210 of the computing device 100 to the rear side 220 of the computing device 100. The airflow 230 in the middle of the computing device 100 draws heat from the heat generating modules 120. The exhaust airflow 235 that exits the computing device 100 through the fans 140 carries the heat generated in the computing device 100 out the rear side 220. Since the heat generating modules 130 and 132 are interspersed between the fans 140 at the rear side 220 of the computing device 100, the spaces 240 and 242 near the heat generating modules 130 and 132, respectively, do not experience the main airflow 230 or the exhaust airflow 235.

Figure 3:
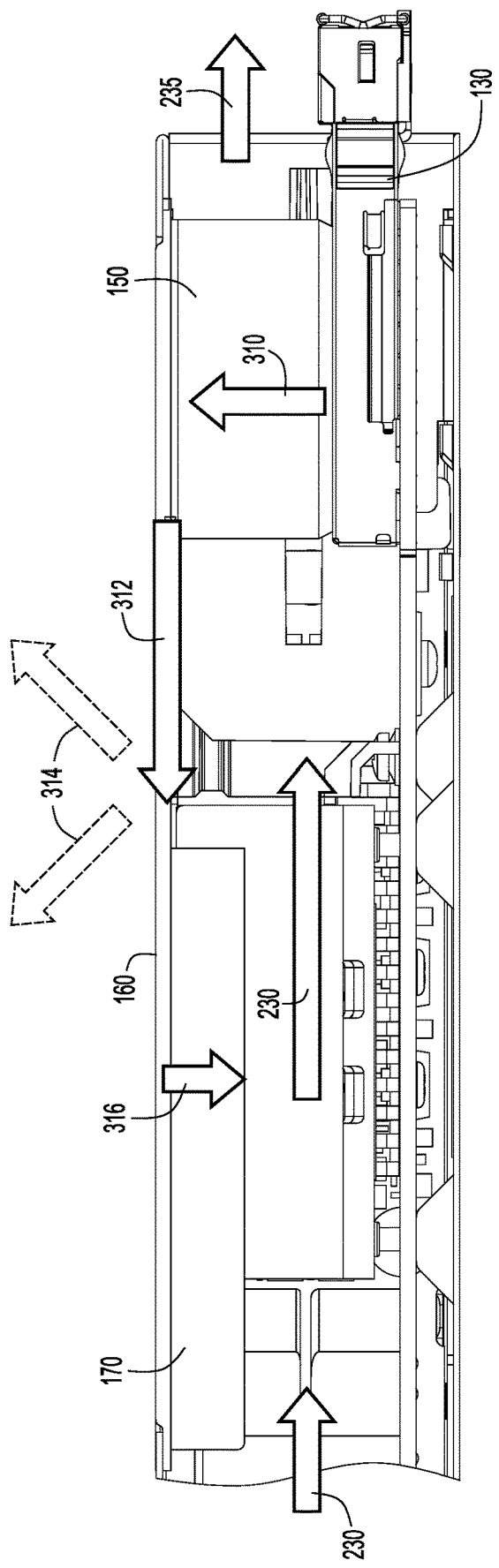
FIG. 3 is a side view of a portion of the computing device that shows the heat flow from a heat generating module in a low airflow zone to a heat dissipating structure in a higher airflow zone, according to an example embodiment.

Referring now to FIG. 3, a side view of the computing device 100 shows the heat flow from the heat generating module 130 to the heat dissipating structure 170 through the heat spreader 160. Heat 310 from the heat generating module 130 travels up through the heat bridge 150 to the heat spreader 160 that is integrated into the outer chassis 110 of the computing device. Heat 312 travels through the heat spreader 160 until it reaches the heat dissipating structure 170. Additional heat 314 may radiate off the top surface of the heat spreader 160. Heat 316 propagates from the heat spreader 160 down into the heat dissipating structure 170, which transfers the heat to the airflow 230. The warmed airflow 230 is pulled through the computing device 100 by the fans 140 and exits the rear of the computing device as exhaust airflow 235.

Figure 4:
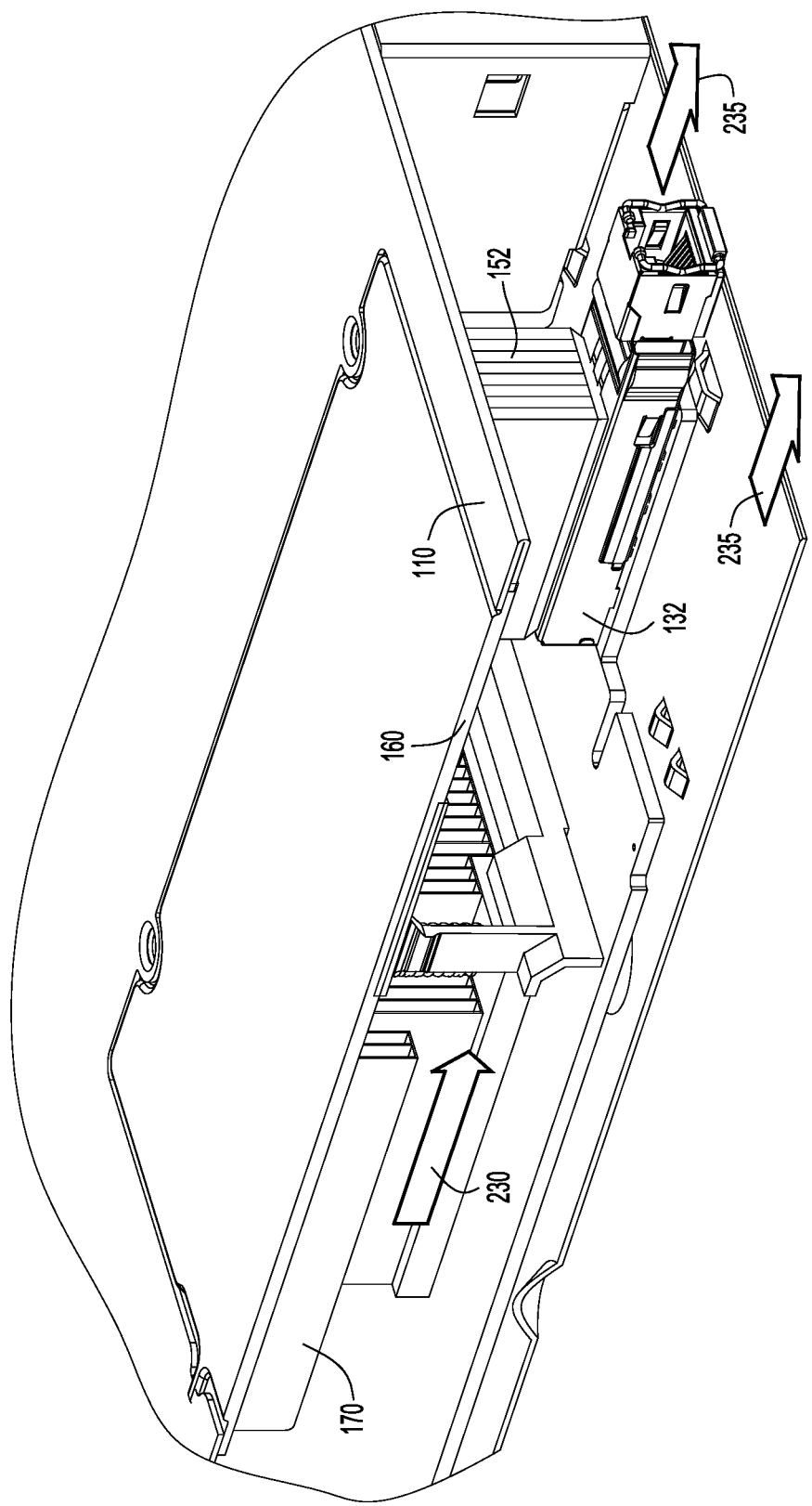
FIG. 4 is a perspective cross-section view of the heat spreading mechanism integrated into the outer chassis of the computing device, according to an example embodiment.

Referring now to FIG. 4, a cutaway drawing of the computing device 100 shows a perspective view of the heat transfer system from the heat generating module 132 to the heat dissipating structure 170. The heat generating module 132 is positioned between the exhaust airflow 235 generated by the fans 140, which are omitted from FIG. 4 for clarity. Since the airflow 235 goes around the heat generating module 132, heat from the heat generating module 132 is directed up the heat bridge 152 to the heat spreader 160 that is integrated into the outer chassis 110 of the computing device 100. The heat spreader 160 conducts the heat from the first location of where the heat bridge 152 contacts the heat spreader 160 to a second location where the heat dissipating structure 170 contacts the heat spreader 160. The airflow 230 in the second location near the heat dissipating structure 170 is higher than any airflow at the first location of the heat bridge 152.

Figure 5:
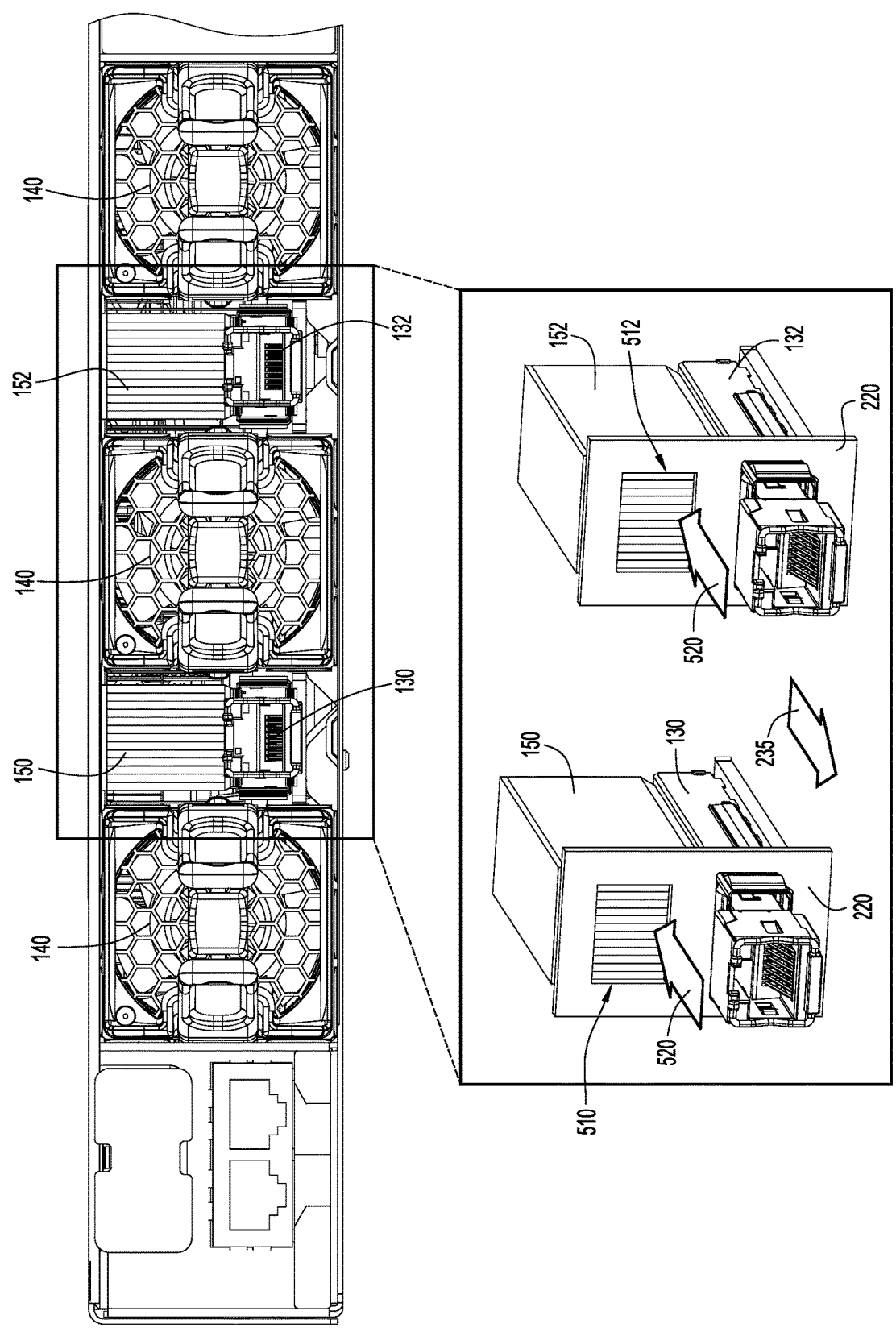
FIG. 5 is a rear view of a portion of the computing device that illustrates the recirculating airflow through rear vents in the outer chassis, according to an example embodiment.

Referring now to FIG. 5, an enlarged view of the rear side 220 of the computing device 100 shows an embodiment of the outer chassis that is configured to provide additional airflow to dissipate heat generated at the heat generating modules 130 and 132. In the example depicted in FIG. 5, the heat bridges 150 and 152 are also heat dissipating structures (e.g., finned heat sinks) that can transfer heat to air flowing through the heat bridges 150 and 152. However, the exhaust airflow 235 bypasses the heat bridges 150 and 152 due to the placement of the fans 140 interspersed with the heat generating modules 130 and 132.

To enable airflow to enter the computing device 100 and transfer heat from the heat bridges 150 and 152, rear vents 510 and 512 are placed in the rear side 220 of the computing device 100 near the heat bridges 150 and 152, respectively. A recirculating airflow 520 enters through the rear vents 510 and 512 in a direction that is substantially reverse from the direction of the exhaust airflow 235. The additional recirculating airflow 520 absorbs heat directly from the heat bridges 150 and 152. The heat path through the heat bridges 150 and 152 to the heat spreader 160 and the heat dissipating structure 170 may still conduct a portion of the heat from heat generating modules 130 and 132, but the recirculating airflow 520 may provide additional cooling.

In one example, the fans 140 may draw the recirculating airflow 520 into the computing device 100 and force the recirculating airflow 520 out with the exhaust airflow 235. Alternatively, the recirculating airflow 520 may exit the computing device 100 through the rear vents 510 and 512. Additionally, secondary fans may be positioned to augment the recirculating airflow 520 through the heat bridges 150 and 152.

Figure 6:
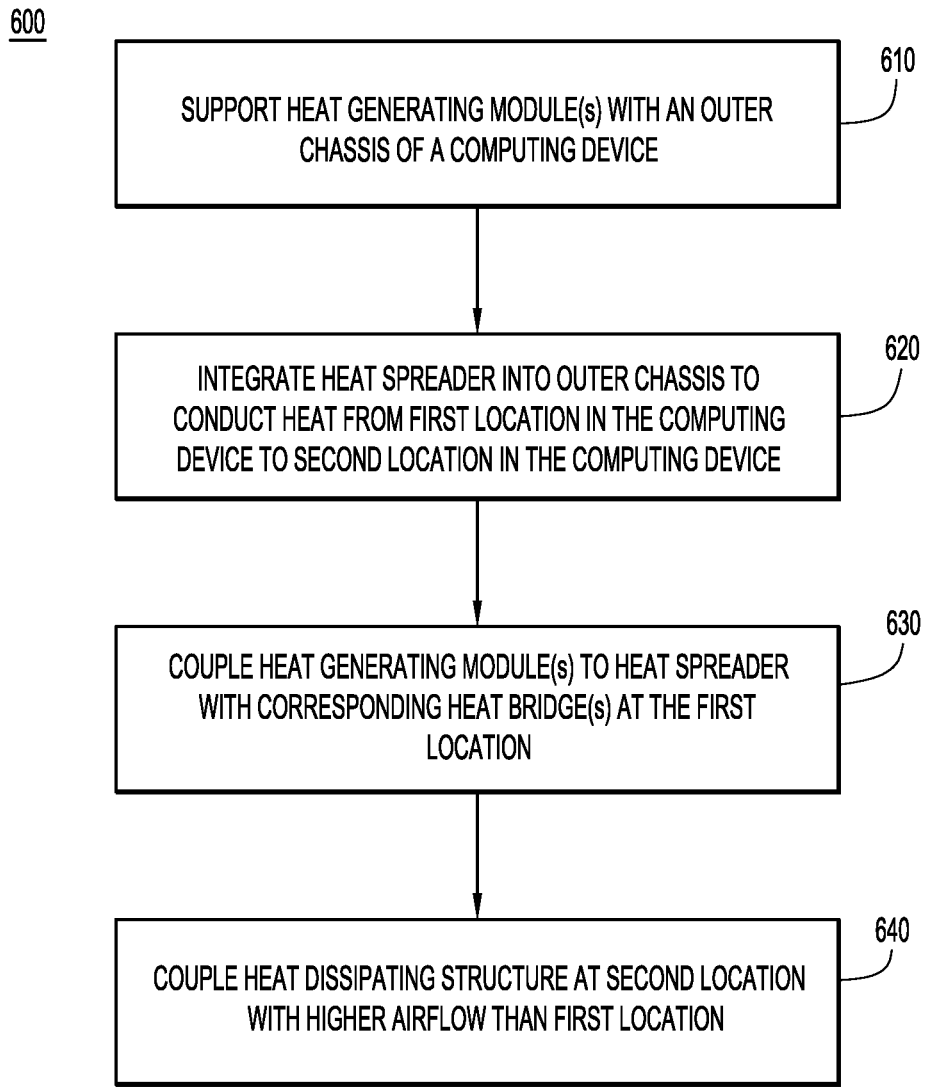
FIG. 6 is a flowchart illustrating operations performed at a computing device to dissipate heat from heat generating modules in a low airflow zone, according to an example embodiment.

Referring now to FIG. 6, a flowchart illustrates operations performed at a computing device (e.g., computing device 100) in a process 600 to efficiently manage thermal energy from heat generating modules (e.g., heat generating modules 130 and 132) that are in an area of low airflow. At 610, the computing device supports one or more heat generating modules with an outer chassis. In one example, the heat generating modules are supported at the rear of the computing device, and may be interspersed with fans to draw airflow through the computing device. In another example, the heat generating modules may be optical network modules (e.g., QFSP-DD modules) configured for network communication (e.g., over an optical network fiber).

At 620, a heat spreader is integrated into the outer chassis of the computing device. The heat spreader is configured to conduct heat from at least one first location (e.g., the location(s) above the heat generating modules) in the computing device and a second location (e.g., the location of a finned heat sink) in the computing device. In one example, the heat spreader may comprise a vapor chamber. In another example, the heat spreader may be integrated into the outer chassis with a large contact area (e.g., a wide flange) to promote thermal conduction to the outer chassis as well conduction to the second location. The contact area between the outer chassis and the heat spreader may include a thermal interface material (e.g., thermal paste, metallic foil, etc.) to improve the thermal conduction to the outer chassis.

At 630, the heat generating modules are coupled to the heat spreader with corresponding heat bridges at the first locations. In one example, the heat bridges may comprise solid blocks of heat conductive material (e.g., metal) or finned heat sinks. In another example, the heat brides may be coupled to the heat generating modules and/or the heat spreader by a thermal interface material that improves heat transfer and reduces contact voids. Alternatively, the heat bridges may be attached to the heat generating modules and/or the heat spreader by mechanical fasteners, brazing, welding, or other types of coupling mechanisms.

At 640, a heat dissipating structure is coupled to the heat spreader at a second location. The second location is positioned in the computing device to experience a higher airflow than the first location where the heat bridges are coupled to the heat spreader. In one example, the heat dissipating structure may comprise a finned heat sink placed in a space of the computing device with available clearance without obstructing nearby components (e.g., other electronics modules).

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure will now be described with more particular reference to the accompanying figures.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

In summary, the techniques described herein enhance the cooling capacity of a computing device incorporating a heat spreader, such as a vapor chamber, directly into the system enclosure. The heat spreader improves heat dissipation for free convection or forced air cooling of electronic modules that are placed in hard-to-reach areas or areas with little or no airflow. The complete heat dissipation system may include the strategic placement of a heat dissipating structure in the pathway of higher airflow, heat spreading on the natural heat sink of the outer chassis, and/or recirculated air through rear vents near the electronic modules.

The cooling system described herein provides a space conscious design for a dense system in which the heat sink is places upside down to remove the need for space on the PCB dedicated to cooling. The system provides cost savings by using proven forced air cooling rather than exotic thermal solutions, such as thermo-electric coolers, liquid cooling, or immersion technology. Additionally, the simplicity of design provides additional cost savings from manufacturing and assembly.

In one form, an apparatus comprising an outer chassis of a computing device, a heat spreader, at least one heat bridge, and a heat dissipating structure is provided. The outer chassis of the computing device is configured to support a plurality of heat generating modules. The heat spreader is integrated into the outer chassis. The at least one heat bridge couples the heat spreader to at least one corresponding heat generating module at a first location in the computing device. The first heat dissipating structure is coupled to the heat spreader at a second location in the computing device. The second location is positioned in the computing device to experience higher airflow than the first location.

In another form, a system comprising a plurality of heat generating modules, at least one main fain, an outer chassis, at least one heat bridge, and a first heat dissipating structure is provided. The at least one main fan in configured to provide airflow through the system. The outer chassis is configured to support the plurality of heat generating modules and includes a heat spreader configured to conduct heat from at least one first location of the outer chassis to at least one second location of the outer chassis. At least one heat bridge couples the heat spreader to at least one corresponding heat generating module at the at least one first location of the outer chassis. The first heat dissipating structure is coupled to the heat spreader at the at least one second location in the computing device. The at least one second location is positioned in the computing device to experience higher airflow than the at least one first location.

In still another form, a method for dissipating heat in a computing device is provided. The method includes supporting at least one heat generating modules with an outer chassis of the computing device. The method also includes integrating a heat spreader into the outer chassis to conduct heat from at least one first location in the computing device to a second location in the computing device. The method further includes coupling that least one heat generating module to the heat spreader with at least one corresponding heat bridge. The at least one corresponding heat bridge is coupled to the heat spreader at the at least one first location. The method also includes coupling a first heat dissipating structure to the heat spreader at the second location. The second location is positioned in the computing device to experience higher airflow than the first location.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
   an outer chassis of a computing device configured to support a plurality of heat generating modules, the plurality of heat generating modules interspersed between an exhaust airflow exiting the computing device;
   a heat spreader integrated into the outer chassis;
   at least one heat bridge coupling the heat spreader to at least one corresponding heat generating module of the plurality of heat generating modules at a first location in the computing device, wherein the first location is inside the outer chassis and positioned in a low volume airflow between the exhaust airflow; and
   a first heat dissipating structure coupled to the heat spreader at a second location inside the outer chassis of the computing device, the second location positioned to experience a higher volume airflow than the low volume airflow at the first location.

2. The apparatus of claim 1, wherein the at least one heat bridge comprises a second heat dissipating structure.

3. The apparatus of claim 2, further comprising a vent in the outer chassis proximate to the first location, the vent allowing additional airflow to cool the second heat dissipating structure.

4. The apparatus of claim 3, wherein the additional airflow cooling the second heat dissipating structure is in a substantially reverse direction to the higher volume airflow at the second location in the computing device.

5. The apparatus of claim 1, further comprising a thermal interface material configured to couple the at least one heat bridge to the at least one corresponding heat generating module.

6. The apparatus of claim 1, wherein the heat spreader comprises a vapor chamber.

7. The apparatus of claim 1, wherein the at least one corresponding heat generating module is an optical network module.

8. A system comprising:
   a plurality of heat generating modules;
   at least one main fan configured to provide an exhaust airflow exiting the system;
   an outer chassis configured to support the plurality of heat generating modules, the plurality of heat generating modules interspersed between the exhaust airflow;
   a heat spreader integrated into the outer chassis, the heat spreader configured to conduct heat between at least one first location of the outer chassis and at least one second location of the outer chassis;
   at least one heat bridge configured to couple to the heat spreader to at least one corresponding heat generating module of the plurality of heat generating modules at the at least one first location, wherein the at least one first location is inside the outer chassis and positioned in a low volume airflow between the exhaust airflow; and
   a first heat dissipating structure coupled to the heat spreader at the at least one second location inside the outer chassis, the at least one second location positioned in the system to experience a higher volume airflow than the low volume airflow at the at least one first location.

9. The system of claim 8, wherein the at least one heat bridge comprises a second heat dissipating structure.

10. The system of claim 9, further comprising a vent in the outer chassis proximate to the at least one first location, the vent allowing additional airflow to cool the second heat dissipating structure.

11. The system of claim 10, wherein the additional airflow cooling the second heat dissipating structure is in a substantially reverse direction to the exhaust airflow provided by the at least one main fan.

12. The system of claim 11, further comprising at least one secondary fan configured to provide the additional airflow in the substantially reverse direction to the exhaust airflow provided by the at least one main fan.

13. The system of claim 8, further comprising a thermal interface material configured to couple the at least one heat bridge to the at least one corresponding heat generating module.

14. The system of claim 8, wherein the heat spreader comprises a vapor chamber.

15. The system of claim 8, wherein the plurality of heat generating modules comprises at least one optical network module.

16. A method comprising:
- supporting at least one heat generating module with an outer chassis of a computing device, the at least one heat generating module interspersed between an exhaust airflow exiting the computing device;
- integrating a heat spreader into the outer chassis to conduct heat from at least one first location in the computing device to a second location in the computing device;
- coupling the at least one heat generating module to the heat spreader with at least one corresponding heat bridge, the at least one corresponding heat bridge coupled to the heat spreader at the at least one first location, wherein the at least one first location is inside the outer chassis and positioned in a low volume airflow between the exhaust airflow; and
- coupling a first heat dissipating structure to the heat spreader at the second location inside the outer chassis, the second location positioned to experience a higher volume airflow than the low volume airflow at the at least one first location.

17. The method of claim 16, wherein coupling the at least one heat generating module to the heat spreader comprises coupling a second heat dissipating structure of the at least one corresponding heat bridge between the at least one heat generating module and the heat spreader.

18. The method of claim 17, further comprising providing additional airflow to the second heat dissipating structure through a vent in the outer chassis.

19. The method of claim 18, wherein providing the additional airflow comprises providing the additional airflow in a substantially reverse direction to the higher volume airflow at the second location in the computing device.

20. The method of claim 16, wherein coupling the at least one heat generating module to the heat spreader comprises coupling the at least one corresponding heat bridge to the at least one corresponding heat generating module with a thermal interface material.

\* \* \* \* \*